United States Patent
Singh et al.

(10) Patent No.: US 7,282,796 B2
(45) Date of Patent: Oct. 16, 2007

(54) ELECTRONIC ASSEMBLY HAVING A MORE DENSE ARRANGEMENT OF CONTACTS THAT ALLOWS FOR ROUTING OF TRACES TO THE CONTACTS

(75) Inventors: Kuljeet Singh, Folsom, CA (US); Kevin E. Wells, El Dorado Hills, CA (US); Julius Delino, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 199 days.

(21) Appl. No.: 10/994,057

(22) Filed: Nov. 18, 2004

(65) Prior Publication Data

US 2005/0087858 A1    Apr. 28, 2005

(51) Int. Cl.
*H01L 23/04* (2006.01)
*H01L 23/48* (2006.01)
*H01L 23/52* (2006.01)

(52) U.S. Cl. .................. 257/698; 257/690; 257/734; 257/773; 257/778; 361/760; 361/777; 174/260; 174/261

(58) Field of Classification Search .................. None
See application file for complete search history.

(56) References Cited

U.S. PATENT DOCUMENTS

| | | |
|---|---|---|
| 4,932,902 A | 6/1990 | Crane, Jr. |
| 5,512,765 A | 4/1996 | Gaverick |
| 5,691,569 A * | 11/1997 | Palmer .................. 257/692 |
| 5,783,870 A | 7/1998 | Mostafazadeh et al. |
| 5,784,262 A | 7/1998 | Sherman |
| 6,064,113 A | 5/2000 | Kirkman |
| 6,376,769 B1 * | 4/2002 | Chung .................. 174/524 |
| 6,417,463 B1 | 7/2002 | Cornelius et al. |
| 6,474,476 B1 | 11/2002 | Anderson et al. |
| 6,556,454 B1 | 4/2003 | D'Amato et al. |
| 6,664,620 B2 | 12/2003 | Siu et al. |
| 6,677,831 B1 | 1/2004 | Cheng et al. |
| 6,730,860 B2 | 5/2004 | Searls et al. |
| 6,770,963 B1 | 8/2004 | Wu |
| 6,814,584 B2 | 11/2004 | Zaderej |
| 2001/0035576 A1 | 11/2001 | Wachtler et al. |
| 2001/0045633 A1 | 11/2001 | Siu et al. |
| 2001/0052960 A1 | 12/2001 | Saito et al. |
| 2002/0060318 A1 | 5/2002 | Katz |
| 2003/0170444 A1 | 9/2003 | Stewart et al. |
| 2003/0183418 A1 | 10/2003 | Castro et al. |
| 2003/0201122 A1 | 10/2003 | Hsu et al. |
| 2003/0228774 A1 | 12/2003 | Zaderej |
| 2005/0067721 A1 | 3/2005 | Blaszczak et al. |

FOREIGN PATENT DOCUMENTS

| | | |
|---|---|---|
| EP | 0 836 243 A2 | 4/1998 |
| EP | 1 311 029 A1 | 5/2003 |

* cited by examiner

*Primary Examiner*—Andy Huynh
*Assistant Examiner*—Hoang-Quan Ho
(74) *Attorney, Agent, or Firm*—Blakely, Sokoloff, Taylor & Zafman LLP

(57) ABSTRACT

An electronic assembly is described, having a substrate and contacts on the substrate which are spaced and arranged in a manner that allows for a more dense arrangement of contacts but still allows for routing of traces between the contacts.

1 Claim, 3 Drawing Sheets

ELECTRONIC ASSEMBLY HAVING A MORE DENSE ARRANGEMENT OF CONTACTS THAT ALLOWS FOR ROUTING OF TRACES TO THE CONTACTS

CROSS-REFERENCE TO OTHER APPLICATIONS

This Application claims priority from U.S. patent application Ser. No. 10/228,524, filed on Aug. 26, 2002.

BACKGROUND OF THE INVENTION

1). Field of the Invention

This invention relates to an electronic assembly, and more particularly to a more dense arrangement of contacts on a substrate of the electronic assembly that still allows for routing of traces to the contacts without the need for expensive/non-standard manufacturing processes or technologies.

2). Discussion of Related Art

Microelectronic dies are usually mounted to package substrates, primarily to provide structural support to the microelectronic dies. Tiny balls are first secured to a surface of the package substrate opposing a side thereof to which the microelectronic die is secured. The balls provide functionality to a circuit in the microelectronic die by providing an electric path through which signals can be transmitted through the package substrate to or from the circuit, or for providing power or ground to the circuit.

The balls are subsequently located against corresponding terminals on a carrier substrate such as a motherboard, and secured to the terminals in a thermal reflow process. Electric signals can then be transmitted through traces in and on surfaces of the carrier substrate through the reflowed balls to or from the circuit.

The balls are usually located in a grid of rows and columns, also referred to as a "ball grid array," abbreviated as "BGA." A BGA package does not allow for a high density of balls while still allowing for routing of traces between outer ones of the balls to inner ones of the balls.

BRIEF DESCRIPTION OF THE DRAWINGS

The invention is described by way of example with reference to the accompanying drawings, wherein.

DETAILED DESCRIPTION OF THE INVENTION

Figure 1:
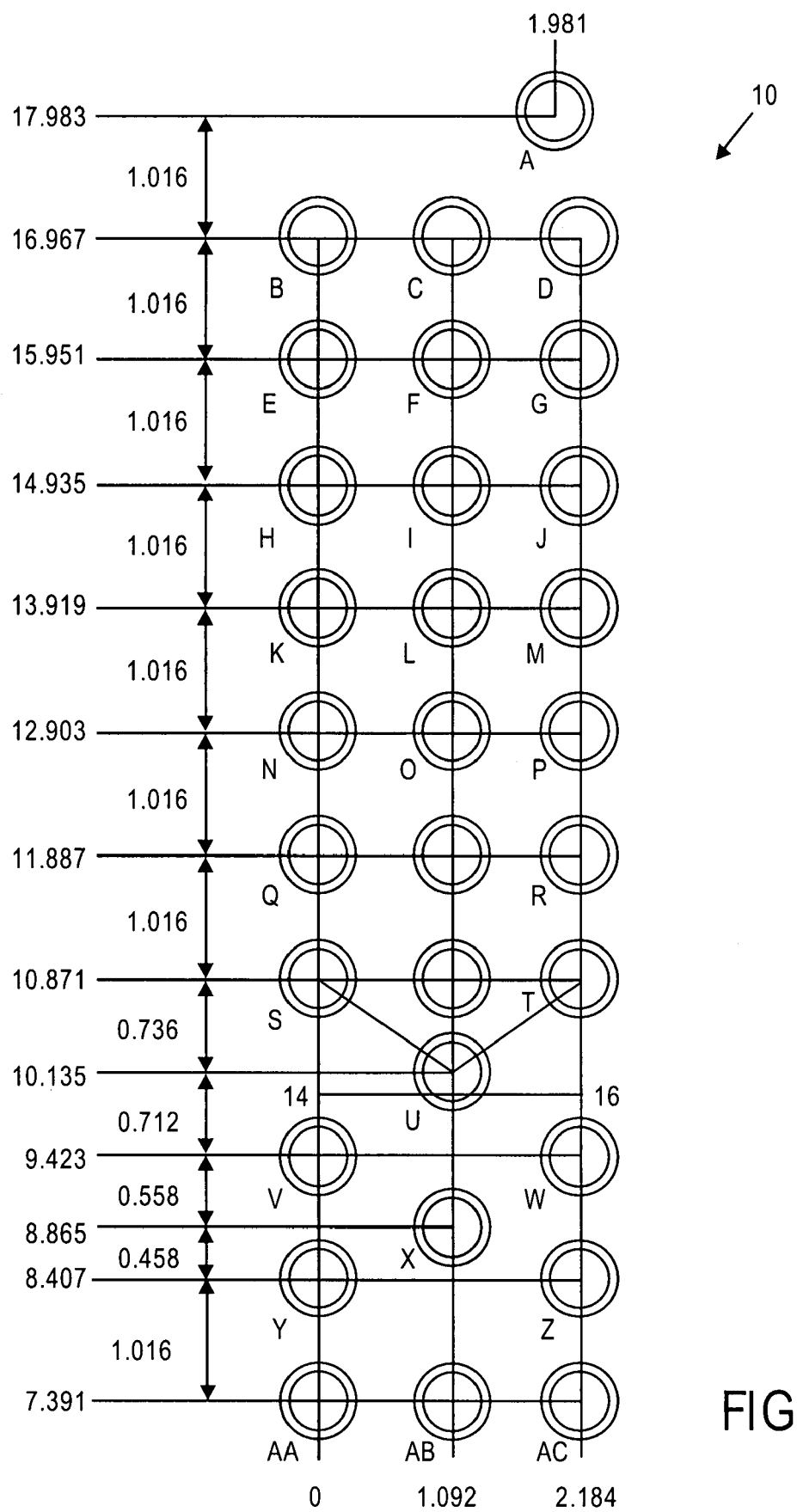
FIG. 1 is a side view of a selection of contacts on a surface of a package substrate when held in a vertical plane.

FIG. 1 of the accompanying drawings illustrates a selection 10 of functional contacts A through AC that are placed on a portion of a package substrate 12. The distances of the functional contacts from a horizontal line through a center of the substrate 12 are given down the left of the figure, and their distances from a vertical axis are given at the bottom.

The contacts B through AC are located in three columns. The first column, which includes contacts B, E, H, K, N, Q, S, V, Y, and AA have center points in a column through a center of the package substrate 12. The contacts C, F, I, L, O, U, and AB have center points in a column that is 1.092 mm from the column containing contact B. The contacts D, G, J, M, P, R, T, W, Z, and AC are in a column that is 2.184 mm from the column containing contact B, and therefore 1.092 mm from the column containing contact C. The contact A is at a distance of 1.981 mm from the column containing contact B.

The contacts B, C, and D have center points that are in a row that is 16.967 mm from the center point of the package substrate 12. The contacts E through P are in similar rows, each row containing three of the contacts and spaced from a previous row by a distance of 1.016 mm. The contacts B through P are thus in a rectangular grid with columns that are spaced from one another by 1.092 mm, and rows that spaced from one another by 1.016 mm. The contact A is at a distance that is 1.016 mm above the row containing contact B.

The contacts Q and R have center points that are in a row that is 1.016 mm below the row containing contact N, and the contacts S and T have center points that are in a row that is spaced by a distance of 1.016 mm from the row containing contact Q. An area is identifiable having a rectangular shape with the contacts Q, S, T, and R on tips of corners of the rectangular shape. The rectangular shape has a width of 2.184 mm and a height of 1.016 mm. The only ones of the contacts that are within the rectangular area are quarters of the contacts Q, S, T, and R. The rectangular area is thus otherwise void of any functional contacts.

The contact U is at a distance of 0.736 mm below the row containing contact S. An imaginary area can be identified by connecting the center point of contact S with reference numeral 14, reference numeral 14 with reference numeral 16, reference numeral 16 with a center point of the contact T, and the center point of the contact T with the center point of the contact S. Such an imaginary area has the same shape, dimensions, and orientation as the rectangular shape defined by center points of the contacts Q, S, T, and R. The imaginary shape thus also has a width of 2.184 mm and a height of 1.016 mm. The imaginary shape also shares one side, namely the side connecting center points of the contacts S and T, with the rectangular shape of the area defined by center points of the contacts Q, S, T, and R. The center point of the contact U is entirely within the imaginary area, and is spaced from all four sides of the imaginary area. It could also be noted that a corridor is identifiable between one column containing contacts Q and S and another column containing contacts R and T, with contact U in an extension of the corridor. What can thus be noted is that a pentagonal shape is identifiable by connecting the center points of the contacts Q, S, U, T, and R. The pentagonal shape is entirely void of any other contacts. The corner of the pentagonal shape defined by connecting the center points of the contacts Q, S, and U is obtuse, as are the corners defined by connecting the center points of the contacts S, U, and T, and by connecting the center points of the contacts U, T, and R, respectively. The corner identifiable by connecting center points of the contacts R, Q, and S is 90°, as is the corner identifiable by connecting center points of the contacts T, R, and Q. A similar pentagonal shape with longer sides is identifiable by connecting center points of the contacts N, Q, S, U, T, R, P, and O, all of which having center points that are on corners or sides of the pentagonal shape as opposed to within the pentagonal shape.

An area having a pentagonal shape is also identifiable by connecting center points of the contacts AA, AB, AC, Z, X, and Y. A corner identifiable by connecting center points of the contacts Y, X, and Z is more obtuse than the corner identifiable by connecting center points of the contacts S, U, and T. The corner defined by center points of contacts Y, X, and Z points toward the corner identifiable by the center points of the contacts S, U, and T. Other aspects of the pentagonal shapes formed by center points of the contacts Q, S, U, T, and R, and center points of the contacts AA, AB, AC, Z, X, and Y are the same. The contacts AA, AB, AC, Z, and Y are on a grid with rows and columns that are spaced from one another by distances that are the same as spaces between rows and columns of a grid on which the contacts B through T are located.

Figure 2:
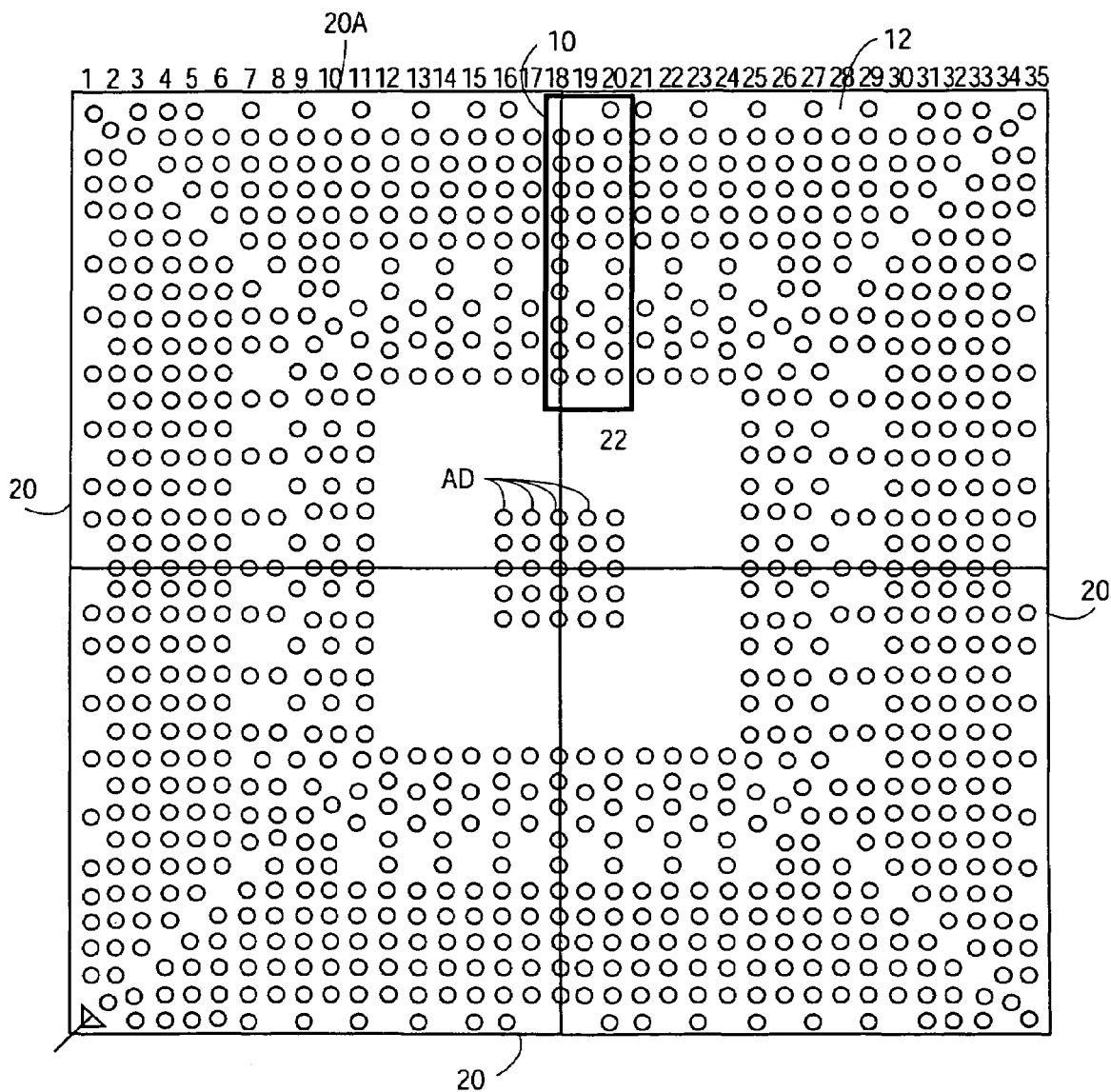
FIG. 2 is a side view of the package substrate, illustrating the selection of contacts of FIG. 1 and other contacts on the package substrate.

The selection 10 is also illustrated on FIG. 2. The contacts in the first two columns of the selection 10 are repeated along all four outer edges of the package substrate 12.

The contacts B through P are in rows extending parallel to a top edge 20A of the package substrate 12, each row being spaced by a distance of 1.016 mm from a previous row. The row containing contact S has ten of the contacts. The other rows containing the contacts B through R each have more than ten contacts. The row containing the contact B, for example, has 31 contacts.

The contacts U through AC are also located in rows extending parallel to the upper edge 20A. The contacts A through P are located in an outer region, whereas the contacts U through AC are located in an intermediate region between the outer region and an inner region of the package substrate 12. The spacings between the rows containing the contacts S, U, V, X, and Y, respectively, are less than the spacings between the rows containing the contacts P through T.

More contacts AD are formed on the inner region of the package substrate 12. The contacts AD have center points that are in rows and columns on the same grid as the contacts on the outer region, namely the contacts B through T. A region between the contacts AD and the row containing the contact AA is free of contacts, and has a width that is approximately five times a spacing between rows of the contacts AD.

Figure 3:
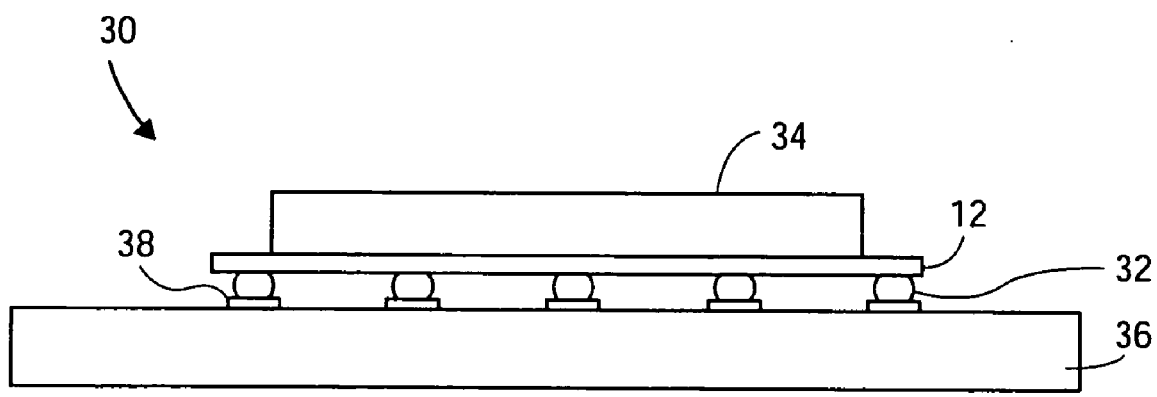
FIG. 3 is a side view after the package substrate is rotated so as to be in a horizontal plane and an electronic assembly is assembled from the package substrate, the contacts thereon, a microelectronic die, and a carrier substrate.

FIG. 3 illustrates a complete electronic assembly 30 that includes the package substrate 12. The contacts hereinbefore described are, in the embodiment illustrated in FIG. 3, in fact tiny balls 32 that are secured to the package substrate 12. The electronic assembly 30 further includes a microelectronic die, typically a semiconductor die 34, mounted on a surface of the package substrate 12 opposing the balls 32. An integrated circuit in the semiconductor die 34 is electrically connected through vias (not shown) in the package substrate 12 to the balls 32.

The electronic assembly 30 further includes a carrier substrate in the form of a motherboard 36 and a plurality of terminals 38 on the motherboard 36. A layout of the terminals 38 is a mirror image of the layout of the balls 32 as illustrated in FIG. 2. Each one of the balls 32 thus contacts a respective one of the terminals 38. The electronic assembly 30 is inserted into a reflow oven which melts the balls 32. The electronic assembly 30 is subsequently allowed to cool, whereafter the balls 32 secure the package substrate 12 to the terminals 38.

The layout illustrated in FIGS. 1 and 2 allows for a more dense layout of the contacts while still allowing for traces to be routed on upper and lower surfaces of the motherboard 36 to the terminals 38. Exactly three traces can be routed between, for example, the contacts B and C because of the pitch of 1.092 mm between the contacts B and C. Although even a slight decrease to a pitch of, for example, to 1.08 mm will disallow routing of three traces, it is within the scope of the invention that the pitch between the columns may be between 1.05 and 1.15 mm. It is also within the scope of the invention that the pitches between the rows containing the contacts A through P are between 1.05 and 1.15 mm. Existing pitches, by contrast, are either 1 mm or 1.20 mm.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic assembly, comprising:

a substrate;

contacts with center points in first, second, and third substantially parallel rows sequentially next to one another on the substrate, each row having at least four of the contacts and a spacing between the first and second rows being between one and two times a spacing between the second and third rows, wherein center points of the contacts of the first and second rows are located on columns extending substantially at right angles to the rows, and center points of the contacts of the third row are located in extensions of corridors between the columns; and contacts in a fourth row having center points on the columns, wherein an area is defined between the third and fourth rows which is free of functional contacts, and at least three times as wide as a spacing between the first and second rows.

* * * * *